(12) United States Patent
Shen et al.

(10) Patent No.: US 9,219,046 B2
(45) Date of Patent: Dec. 22, 2015

(54) STRENGTH OF MICRO-BUMP JOINTS

(71) Applicant: Taiwan Semiconductor Manufacturing Company, Ltd., Hsin-Chu (TW)

(72) Inventors: Wen-Wei Shen, Xinzhuang (TW); Chen-Shien Chen, Zhubei (TW); Chen-Cheng Kuo, Chu-Pei (TW); Ming-Fa Chen, Taichung (TW); Rung-De Wang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/521,233

(22) Filed: Oct. 22, 2014

(65) Prior Publication Data
US 2015/0037936 A1 Feb. 5, 2015

Related U.S. Application Data

(63) Continuation of application No. 12/789,696, filed on May 28, 2010, now Pat. No. 8,901,736.

(51) Int. Cl.
*H01L 21/02* (2006.01)
*H01L 23/00* (2006.01)
(Continued)

(52) U.S. Cl.
CPC ............ *H01L 24/11* (2013.01); *H01L 23/3157* (2013.01); *H01L 24/13* (2013.01); *H01L 24/16* (2013.01); *H01L 24/81* (2013.01); *H01L 25/0657* (2013.01); *H01L 2224/0401* (2013.01); *H01L 2224/05023* (2013.01); *H01L 2224/05155* (2013.01); *H01L 2224/05568* (2013.01); *H01L 2224/05572* (2013.01); *H01L 2224/05647* (2013.01); *H01L 2224/05666* (2013.01); *H01L 2224/1146* (2013.01); *H01L 2224/1191* (2013.01); *H01L 2224/11823* (2013.01); *H01L 2224/11831* (2013.01); *H01L 2224/13005* (2013.01); *H01L 2224/1308* (2013.01); *H01L 2224/13018* (2013.01); *H01L 2224/13019* (2013.01); *H01L 2224/1357* (2013.01); *H01L 2224/1369* (2013.01); *H01L 2224/13076* (2013.01); *H01L 2224/13083* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13565* (2013.01); *H01L 2224/16148* (2013.01); *H01L 2224/16238* (2013.01); *H01L 2224/81193* (2013.01); *H01L 2224/81345* (2013.01); *H01L 2224/81815* (2013.01); *H01L 2225/06513* (2013.01); *H01L 2225/06541* (2013.01);
(Continued)

(58) Field of Classification Search
CPC ......... H01L 24/10; H01L 24/11; H01L 24/13; H01L 24/81
See application file for complete search history.

(56) References Cited

U.S. PATENT DOCUMENTS 4,811,082 A 3/1989 Jacobs et al.
4,990,462 A 2/1991 Sliwa, Jr.
(Continued)

*Primary Examiner* — Jae Lee
(74) *Attorney, Agent, or Firm* — Slater & Matsil, L.L.P.

(57) ABSTRACT

A device includes a work piece including a metal bump; and a dielectric layer having a portion directly over the metal bump. The metal bump and a surface of the portion of the dielectric layer form an interface. A metal finish is formed over and contacting the metal bump. The metal finish extends from over the dielectric layer to below the interface.

20 Claims, 6 Drawing Sheets

(51) Int. Cl.
*H01L 23/31* (2006.01)
*H01L 25/065* (2006.01)

(52) U.S. Cl.
CPC .......... *H01L2924/0002* (2013.01); *H01L 2924/00014* (2013.01); *H01L 2924/01028* (2013.01); *H01L 2924/01029* (2013.01); *H01L 2924/01046* (2013.01); *H01L 2924/01079* (2013.01); *H01L 2924/01322* (2013.01); *H01L 2924/10253* (2013.01); *H01L 2924/14* (2013.01); *H01L 2924/35* (2013.01); *Y10T 428/12361* (2015.01); *Y10T 428/12396* (2015.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,287,950 | B1 * | 9/2001 | Wu et al. ............ 438/612 |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,806,578 | B2 | 10/2004 | Howell et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 7,923,836 | B2 | 4/2011 | Farooq et al. |
| 7,952,206 | B2 | 5/2011 | Bachman et al. |
| 7,973,406 | B2 | 7/2011 | Pendse |
| 8,072,070 | B2 | 12/2011 | Lee et al. |
| 2007/0020906 | A1 | 1/2007 | Chiu et al. |
| 2007/0026631 | A1 | 2/2007 | Lin et al. |
| 2007/0087544 | A1 | 4/2007 | Chang et al. |
| 2008/0284016 | A1 * | 11/2008 | Huang et al. ............ 257/737 |

* cited by examiner

STRENGTH OF MICRO-BUMP JOINTS

This application is a continuation of U.S. patent application Ser. No. 12/789,696, entitled "Strength of Micro-Bump Joints" filed on May 28, 2010, which application is hereby incorporated herein by reference.

TECHNICAL FIELD

This disclosure relates generally to integrated circuits, and more particularly to micro-bump joints with improved strength and method of forming the same.

BACKGROUND

In the manufacturing of wafers, integrated circuit devices such as transistors are first formed at the surfaces of semiconductor substrates. Interconnect structures are then formed over the integrated circuit devices. Bumps are formed on the surfaces of the semiconductor wafers, and are electrically coupled to integrated circuit devices. The semiconductor wafers are sawed into semiconductor chips, also commonly known as dies.

In the packaging of the semiconductor chips, the semiconductor chips are often bonded with other chips or package substrates using flip-chip bonding. Solders are used to join the bumps in the semiconductor chips, or join the bumps in the semiconductor chips to the bond pads in the package substrates. When two semiconductor chips (or one semiconductor chip and a package substrate) are bonded, a solder bump may be pre-formed on one of the bumps or bond pads. A re-flow is then performed so that the solder bump joins the semiconductor chips. Conventional bumps were typically large, and hence micro-bumps were developed. Micro-bump flip-chip interconnections allow for high bonding densities.

FIG. 1 illustrates an exemplary micro-bump on chip 200, with micro-bump 210 formed at a surface of chip 200. Micro-bump 210 includes nickel layer 212, and copper pad 214 on nickel layer 214. Silicon nitride layer 216 covers the edge portion of micro-bump 210, with a center portion of the top surface of copper pad 214 not covered. Electroless nickel electroless palladium immersion gold (ENEPIG) finish 220 is formed to cover copper pad 214, which is exposed through the opening in silicon nitride layer 216. Bump 210 as shown in FIG. 1 will be joined with bump 230 of chip 232 by re-flowing solder cap 234, so that chips 200 and 232 are bonded together.

SUMMARY

In accordance with one aspect of the embodiment, a device includes a work piece including a metal bump; and a dielectric layer having a portion directly over the metal bump. The metal bump and a surface of the portion of the dielectric layer form an interface. A metal finish is formed over and contacting the metal bump. The metal finish extends from over the dielectric layer to below the interface.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel bond structure is provided in accordance with an embodiment. The variations of the embodiment are discussed. Throughout the various views and illustrative embodiments, like reference numbers are used to designate like elements.

Figure 1:
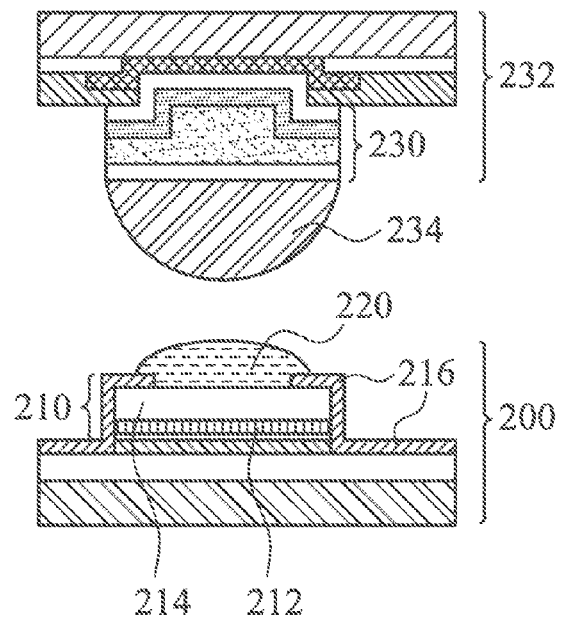
FIG. 1 illustrates a cross-sectional view of a conventional micro-bump structure.
Figure 2:
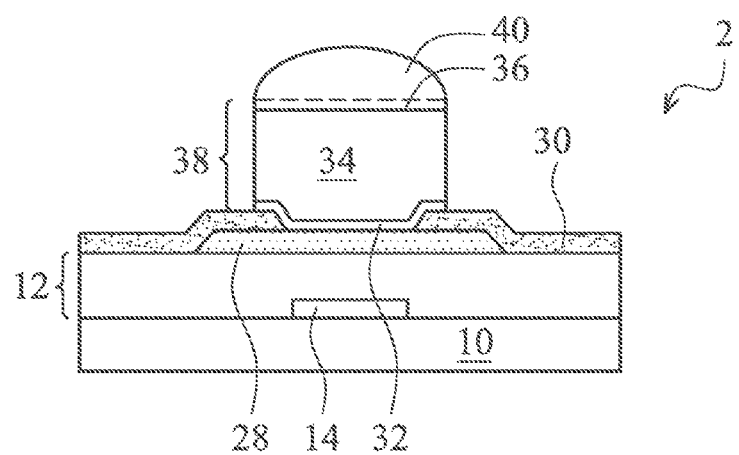
FIGS. 2 through 6 are cross-sectional views of intermediate stages in the formation of bond structures in accordance with various embodiments.

Referring to FIG. 2, work piece 2, which includes substrate 10, is provided. Work piece 2 may be a device die that includes active devices such as transistors therein, although it may also be a package substrate or an interposer that does not have active devices therein. In an embodiment wherein work piece 2 is a device die, substrate 10 may be a semiconductor substrate such as a silicon substrate, although it may include other semiconductor materials. Semiconductor devices 14 such as transistors may be formed at a surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include a commonly known inter-layer dielectric (ILD) and inter-metal dielectrics (IMDs).

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnection structure 12. Passivation layer 30 may be formed to cover edge portions of metal pad 28. In an exemplary embodiment, passivation layer 30 is formed of polyimide or other known dielectric materials.

Under bump metallurgy (UBM) 32 is formed on, and electrically connected to, metal pad 28. UBM 32 may include a copper layer and a titanium layer (not shown). Copper bump 34 is formed on UBM 32. In an embodiment, copper bump 34 is formed by plating. An exemplary plating process includes forming a blanket UBM layer (not shown, wherein UBM 32 is a part of the UBM layer), forming a mask (not shown) on the UBM layer, patterning the mask to form an opening, plating copper bump 34 into the opening, and removing the mask and the portion of the UBM layer previously covered by the mask. Copper bump 34 may be formed of substantially pure copper or copper alloys.

Metal finish 36 may be formed on copper bump 34, for example, by plating. Metal finish 36 may comprise different materials and layers, and may be used to prevent the oxidation and the diffusion of copper bump 34 to/from solder cap 40. In an embodiment, metal finish 36 is formed of nickel, although other metals may be added. Alternatively, metal finish 36 may be formed of electroless nickel electroless palladium immersion gold (ENEPIG), which includes a nickel layer, a palladium layer on the nickel layer, and a gold layer on the palladium layer. Metal finish 36 may be limited in the region directly over copper bump 34, and is not formed on sidewalls of copper bump 34. Alternatively, metal finish 36 is also formed on the sidewalls of copper bump 34. In subsequent discussion, UBM 32, copper bump 34, and metal finish 36 in combination are referred to as metal bump 38. Solder cap 40 may be formed on metal bump 38, and may comprise a lead-free solder material containing, for example, SnAg, SnAgCu, and the like, although solder cap 40 may also be formed of an eutectic solder material containing, for example, lead (Pb) and tin (Sn).

Figure 3:
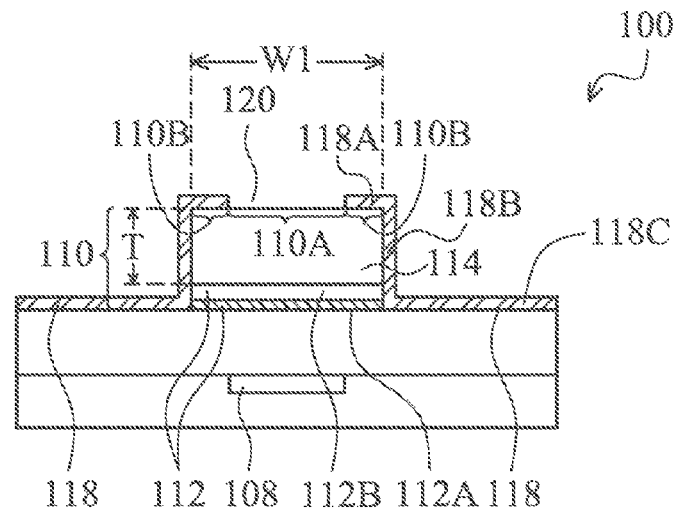

FIG. 3 illustrates work piece 100, which may be a semiconductor chip, although it may also be a package substrate. Further, the structure shown in FIG. 3 may be a backside or a front side of a silicon chip/die/wafer. Work piece 100 may include metal bump 110. Through-substrate vias (TSVs, not shown) may be formed in work piece 100 for forming three-dimensional integrated circuits (3DICs). Electrical connections such as redistribution lines (not shown) may be formed in work piece 100. Through the electrical connections, metal bump 110 may be electrically coupled to the integrated circuit devices 108 in work piece 100 and/or the TSVs therein.

Metal bump 110 comprises metal layer 112, which may include nickel layer 112A and copper seed layer 112B, for example. Metal layer 112 may act as an UBM and a barrier layer for the formation of metal layer 114. In an exemplary embodiment, the thickness of nickel layer 112A may be between about 200 Å to about 1000 Å, and the thickness of copper seed layer 112B may be between about 1 kÅ to about 5 kÅ. One skilled in the art will realize, however, that the dimensions recited throughout the description are merely examples, and will change if different formation technologies are used. Metal layer 114 is formed over metal layer 112, for example, by electro or electroless plating. Metal layer 114 may be formed of copper (for example, pure or substantially pure copper), aluminum, silver, and alloys thereof. Thickness T of metal layer 114 may be between about 1 μm to about 10 μm. Throughout the description, metal layer 112 and metal layer 114 in combination are referred to micro-bump 110. In a top view, micro-bump 110 may appear to have a rectangular, square, or a circular shape. A horizontal dimension W1 (which may be a length, a width, or a diameter, depending on the shape of micro-bump 110) may be between about 5 μm and about 30 μm, although different dimensional may be used.

After the formation of micro-bump 110, dielectric layer 118 is blanket formed to cover the surface of work piece 100. The formation methods of dielectric layer 118 may include chemical vapor deposition (CVD) methods such as plasma enhanced CVD (PECVD) or other applicable methods. The thickness of dielectric layer 118 may be between about 0.1 μm and about 1 μm. Dielectric layer 118 may be a conformal layer, wherein the thickness of sidewall portions on the sidewalls of micro-bump 110 is close to the thickness of horizontal portions. Further, dielectric layer 118 comprises a first portion 118A directly over micro-bump 110, a sidewall portion 118B, and a second portion 118C not directly over micro-bump 110, wherein portions 118A and 118C are connected to opposite ends of sidewall portion 118B. A patterning is then performed to form opening 120 in dielectric layer 118, with micro-bump 110 being exposed through opening 120. Dielectric layer 118 may be formed of silicon nitride, although other dielectric materials such as silicon oxide, silicon oxynitride, or the like, may be used. After the formation of opening 120, the top surface of micro-bump 110 includes two portions, center portion 110A that is exposed through opening 120, and edge portion 110B that is covered by dielectric layer 118, wherein portion 110A is substantially level with portion 110B. Edge portion 110B of the top surface of micro-bump 110 is also the interface between the bottom surface of dielectric portion 118A and the top surface of micro-bump 110. Accordingly, the interface is also denoted as 110B.

Figure 4:
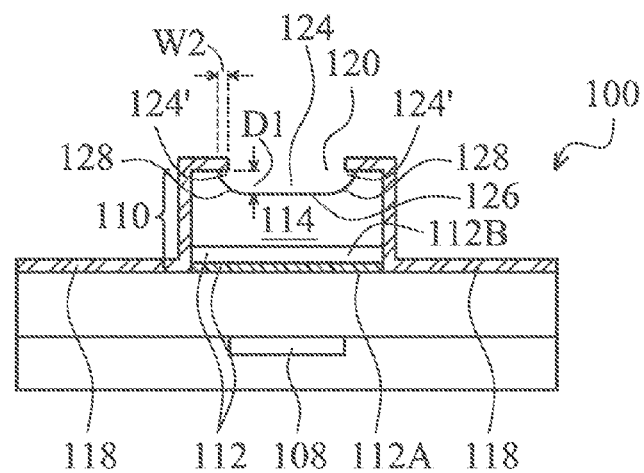

Referring to FIG. 4, an etch is performed using an etchant attacking micro-bump 110/metal layer 114, and not attacking dielectric layer 118. The etch may be isotropic, although an anisotropic effect may be combined with the isotropic effect. Accordingly, a wet etch may be used, for example, using $H_2SO_4$ as an etchant. Metal layer 114 is thus recessed, with recess 124 being formed. In an exemplary embodiment, depth D1 of recess 124 is greater than about 1 μm, or even greater than about 2 μm. Depth D1 may also be between about 1,000 Å and about 2 μm. Due to the nature of isotropic etching, recess 124 may include a substantially flat bottom 126, which is also the top surface of the recessed portion of metal layer 114. Further, corners 128 of recess 124 may be rounded. Recess 124 may extend to directly underlying dielectric layer 118 to form undercut 124', wherein width W2 of undercut 124' may be greater than about 0.5 μm, or even greater than about 2 μm.

Figure 5:
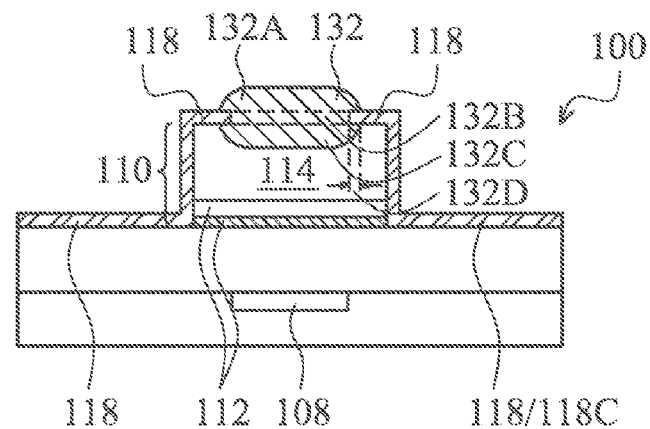

Next, as shown in FIG. 5, metal finish 132 is formed. In an embodiment, metal finish 132 may be formed of nickel, although other metals may be added. Alternatively, metal finish 132 may be formed of electroless nickel electroless palladium immersion gold (ENEPIG), which includes a nickel layer, a palladium layer on the nickel layer, and a gold layer on the palladium layer. The gold layer may be formed using immersion plating. In other embodiments, metal finish 132 may be formed of other known finish materials and methods, including, but not limited to, electroless nickel immersion gold (ENIG), direct immersion gold (DIG), or the like. Depending on the type of metal finish 132, methods including electroless plating, immersion, and the like, may be used to selectively form metal finish 132 starting from the exposed portion of metal layer 114. Accordingly, recess 124, including undercut 124', is filled. The resulting metal finish 132 includes portion 132A over portion 118A of dielectric layer 118, portion 132B that is level with portion 118A of dielectric layer 118, and portion 132C that is lower than portion 118A of dielectric layer 118 and extending into metal layer 114. Furthermore, portion 132D, which is a part of 132C, is in undercut 124', and is directly under dielectric layer 118. The top surface of metal finish 132 may be higher than the top surface of dielectric layer 118. Metal finish 132 may extend to directly over portions of dielectric layer 118. Further, the top surface of metal finish 132 may be rounded.

Figure 6:
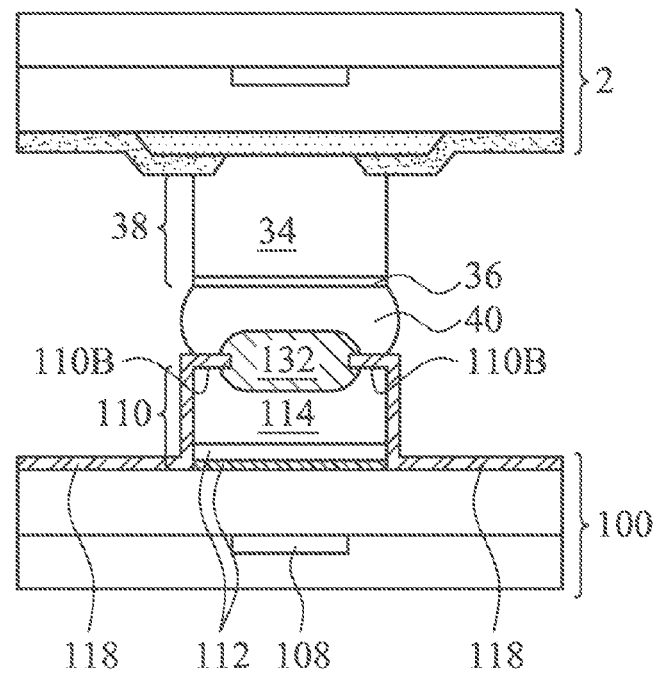

Work piece 2 and work piece 100 may be bonded through flip-chip bonding, as shown in FIG. 6. A reflow process is performed to melt solder cap 40 (FIG. 2). Solder cap 40 thus bonds work piece 2 and work piece 100. In the resulting structure, the interface between metal finish 132 and metal (copper) layer 114 is below the interface 110B, which were conventionally the weak points that prone to cracking and breaking. Instead, the internal bond of metal finish 132, which is much stronger than the interface between metal finish 132 and metal layer 114, is located at the same level as interface 110B. Further, metal finish 132 not only forms a large interface area with metal layer 114, it may also extend directly below dielectric layer 118. Therefore, the bonding between metal finish 132 and metal layer 114 is also strong. The reliability of the entire bond structure is improved.

Figure 7:
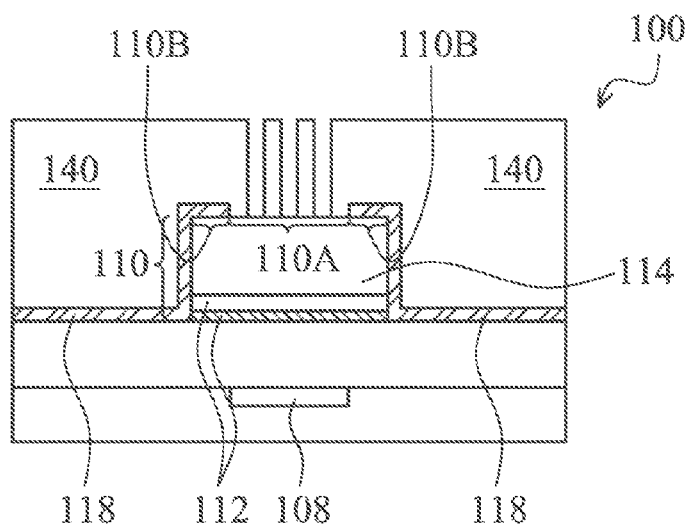
FIGS. 7 through 9 are cross-sectional views and top views of intermediate stages in the formation of bond structures in accordance with various alternative embodiments.
Figure 8A:
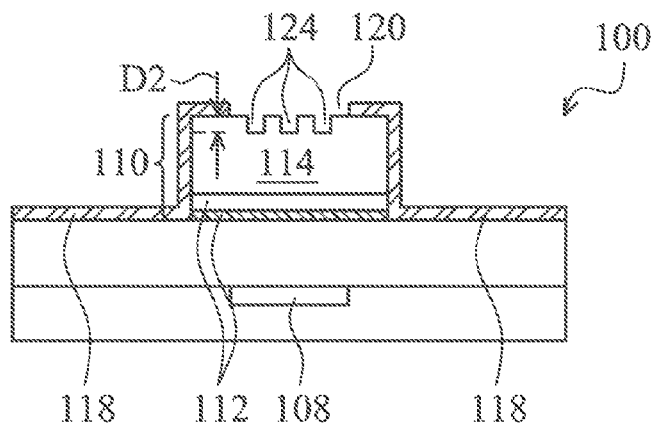
Figure 8B:
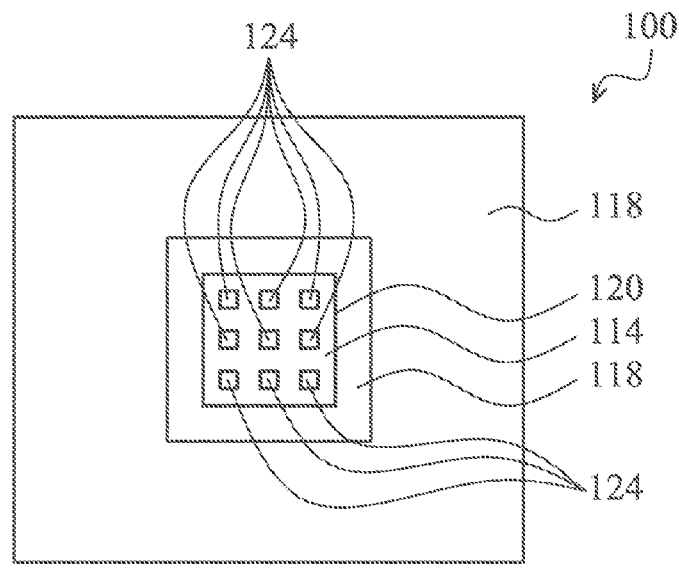
Figure 8C:
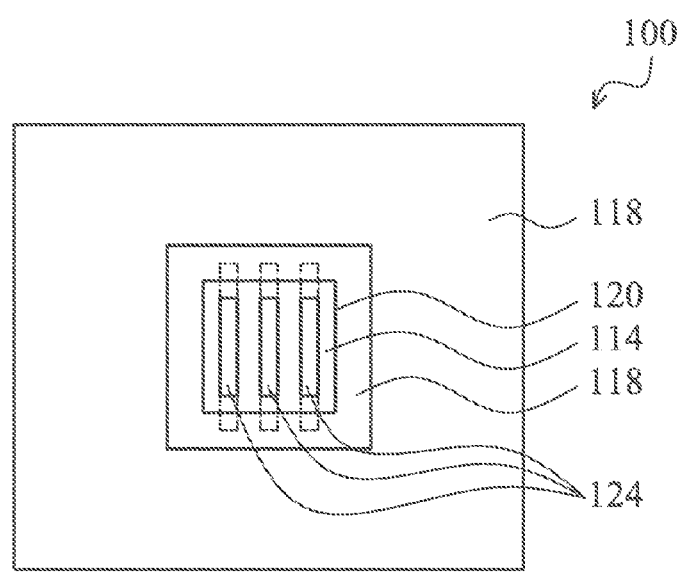
Figure 9:
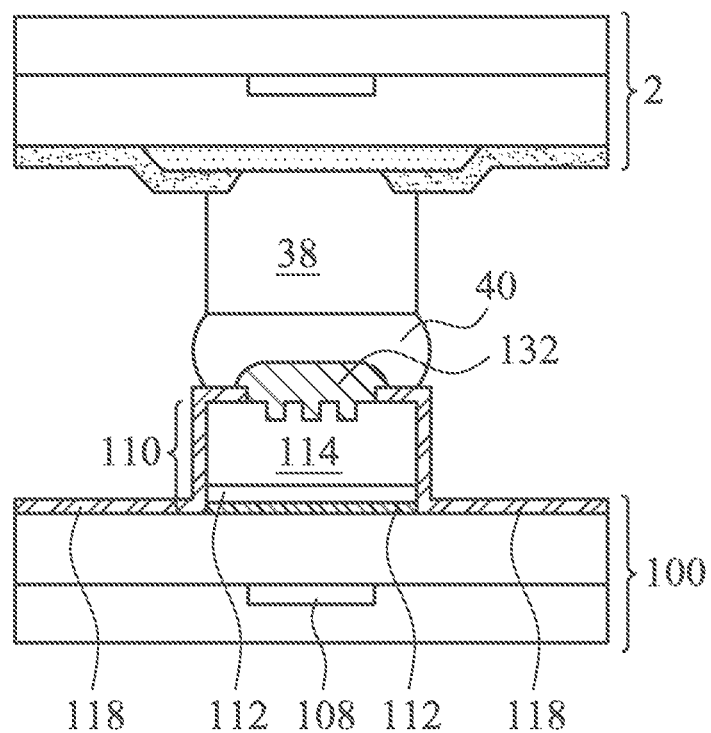

In the embodiments shown in FIGS. 2 through 6, recess 124 is formed using dielectric layer 118 as a self-aligned mask. In alternative embodiments, an additional mask may be used to form recesses in metal layer 114. FIGS. 7 through 9 illustrate variations of embodiments. Unless specified otherwise, the reference numerals in these embodiments represent like elements in the embodiments illustrated in FIGS. 2 through 6. The initial steps of this embodiment are essentially the same as shown in FIGS. 2 and 3. Next, as shown in FIG. 7, mask 140 is formed on the surface of work piece 100, wherein mask 140 may be a photo resist. Mask 140 is patterned so that some portions of top surface 110A of metal layer 114 are exposed, while some other portions are covered. An etch is then performed to etch exposed portions of metal layer 114 to form recesses 124, as shown in FIGS. 8A through 8C. The etch may be an isotropic etch, an anisotropic etch, or the combinations thereof. In the resulting structure, depth D2 of recesses 124 may be greater than about 1 μm, or even greater than about 2 μm. Depth D2 may also be between about 1,000 Å and about 3 μm.

After the etching, mask 140 is removed. The resulting structure is shown in FIGS. 8A through 8C, wherein FIG. 8A is a cross-sectional view, while FIGS. 8B and 8C are top views in accordance with different embodiments. In the top views, it is observed that recesses 124 may have various different patterns. For example, as shown in FIG. 8B, recesses are isolated holes arranged in a periodic pattern such as an array. In FIG. 8C, recesses 124 are parallel trenches, in which the strips of metal finished 132 are formed. Further, recesses 124 may extend directly under dielectric layer 118, as shown in FIG. 8C using dotted lines.

Referring to FIG. 9, metal finish 132 is formed, the resulting work piece 100 is then bonded to work piece 2. The formation process and the materials of metal finish 132 may be essentially the same as in the embodiments shown in FIG. 5, and hence are not discussed herein. In the resulting structure, it is observed that metal finish 132 may form vias extending into metal layer 114. As a result, the interface area between metal layer 114 and metal finish 132 is increased, resulting in the improvement in the strength of the resulting bond structure. Further, metal finish 132 also extends directly under dielectric layer 118, so that the strength of the bond structure is further improved.

In the embodiments, by extending metal finish 132 below the interface between dielectric layer 118 and micro-bump 110 (metal layer 114), the strength of the resulting bonding is significantly improved. Experiments have been performed to study conventional bond structures in which the interfaces between the metal finishes and the micro-bumps are level with the interface between the dielectric layers and the micro-bumps. In the experiments, two chips bonded through the conventional micro-bumps were pulled away from each other. The experiment results revealed that 80 percent of the bond broke at the interfaces between the metal finishes and the micro-bumps. Accordingly, with the embodiments, the conventional weak points are strengthened, and the reliability of the bond structures is improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
    forming a metal bump on a first work piece;
    forming a dielectric layer over and contacting the metal bump;
    forming an opening in the dielectric layer to expose a portion of the metal bump;
    etching the portion of the metal bump exposed through the opening to form a recess, a portion of the recess extending to directly under the dielectric layer; and
    forming a metal finish on the metal bump, with at least a portion of the metal finish formed in the recess.

2. The method of claim 1 further comprising providing a second work piece comprising an additional metal bump, and bonding the additional metal bump of the second work piece to the metal bump of the first work piece.

3. The method of claim 1, wherein the step of etching the portion of the metal bump is performed using the dielectric layer as a self-aligned mask, with no additional mask formed over the dielectric layer.

4. The method of claim 1 further comprising:
    after the step of forming the opening, forming a patterned mask over the dielectric layer, the metal bump comprising portions exposed through the patterned mask; and
    performing the step of etching the portion of the metal bump through openings in the patterned mask.

5. The method of claim 1, wherein the recess comprises a plurality of isolated portions isolated from each other by un-etched portions of the metal bump.

6. The method of claim 1, wherein the step of etching comprises an isotropic etching process.

7. The method of claim 1, wherein the step of forming the metal finish comprises electroless plating.

8. The method of claim 1, wherein the metal bump comprises copper, and wherein the metal finish comprises nickel.

9. A method of forming a device, the method comprising:
    forming a metal bump protruding above a top surface of a substrate, the metal bump comprising sidewalls and a top surface;
    forming a dielectric layer comprising a first portion directly over the top surface of the metal bump, and a second portion on the sidewalls of the metal bump, the metal bump and the first portion of the dielectric layer forming an interface;
    etching the first portion of the dielectric layer to form an opening, a portion of the metal bump being exposed through the opening;
    etching the portion of the metal bump to form a recess in the metal bump, the recess extending to directly under the dielectric layer to form an undercut; and
    performing a selective plating to form a metal finish in the recess, a portion of the metal finish extending into the undercut.

10. The method of claim 9, wherein the metal finish comprises a portion extending to directly over the first portion of the dielectric layer.

11. The method of claim 9, wherein the recess comprises a plurality of isolated portions isolated from each other by un-etched portions of the metal bump.

12. The method of claim 9, wherein the step of etching the portion of the metal bump is performed with no additional mask formed over the dielectric layer.

13. The method of claim 9, wherein the step of etching the portion of the metal bump is performed with a patterned mask over the dielectric layer, and wherein the portion of the metal bump is etched through openings in the patterned mask.

14. The method of claim 9, wherein the metal finish comprises electroless nickel electroless palladium immersion gold (ENEPIG).

15. A method of forming a device, the method comprising:
forming a metal bump on a first work piece, the metal bump comprising a top surface comprising a center portion and an edge portion surrounding the center portion;
forming a dielectric layer to cover the edge portion of the metal bump;
recessing the center portion of the metal bump to form a recess in the metal bump; and
plating a metal finish on the metal bump, the metal finish comprising a portion extending down into the recess and directly under a portion of the dielectric layer.

16. The method of claim 15 further comprising providing a second work piece comprising an additional metal bump, and bonding the additional metal bump of the second work piece to the metal finish.

17. The method of claim 15, wherein the metal finish comprises another portion extending to directly over the dielectric layer.

18. The method of claim 15, wherein the step of etching the center portion of the metal bump is performed using the dielectric layer as a self-aligned mask.

19. The method of claim 15 further comprising:
forming a patterned mask over the metal bump, a portion of the metal bump being exposed through the patterned mask; and
performing the step of recessing through the patterned mask.

20. The method of claim 15, wherein the metal bump comprises copper.

* * * * *